(12) United States Patent
Lin et al.

(10) Patent No.: US 12,132,103 B2
(45) Date of Patent: Oct. 29, 2024

(54) HIGH ELECTRON MOBILITY TRANSISTOR AND FABRICATION METHOD THEREOF

(71) Applicant: Vanguard International Semiconductor Corporation, Hsinchu (TW)

(72) Inventors: Yung-Fong Lin, Taoyuan (TW); Yu-Chieh Chou, New Taipei (TW); Tsung-Hsiang Lin, New Taipei (TW); Li-Wen Chuang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 531 days.

(21) Appl. No.: 17/231,032

(22) Filed: Apr. 15, 2021

(65) Prior Publication Data

US 2022/0336649 A1 Oct. 20, 2022

(51) Int. Cl.
*H01L 29/778* (2006.01)
*H01L 21/285* (2006.01)
(Continued)

(52) U.S. Cl.
CPC .... *H01L 29/7786* (2013.01); *H01L 21/28581* (2013.01); *H01L 29/2003* (2013.01);
(Continued)

(58) Field of Classification Search
CPC ........... H01L 29/7786; H01L 29/66462; H01L 29/205; H01L 29/66431; H01L 21/28581; H01L 29/475
See application file for complete search history.

(56) References Cited

U.S. PATENT DOCUMENTS 8,384,129 B2 * 2/2013 Kub .................. H01L 29/66462
257/E29.252
8,936,976 B2 * 1/2015 Radosavljevic .... H01L 21/2256
438/371

(Continued)

FOREIGN PATENT DOCUMENTS

TW I375326 10/2012
TW I674631 B 10/2019

*Primary Examiner* — Walter H Swanson
*Assistant Examiner* — Jacob T Nelson
(74) *Attorney, Agent, or Firm* — Winston Hsu (57) ABSTRACT

A high electron mobility transistor (HEMT) includes a semiconductor channel layer, a semiconductor barrier layer, a patterned semiconductor capping layer, and a patterned semiconductor protection layer disposed on a substrate in sequence. The HEMT further includes an interlayer dielectric layer and a gate electrode. The interlayer dielectric layer covers the patterned semiconductor capping layer and the patterned semiconductor protection layer, and includes a gate contact hole. The gate electrode is disposed in the gate contact hole and electrically coupled to the patterned semiconductor capping layer, where the patterned semiconductor protection layer is disposed between the gate electrode and the patterned semiconductor capping layer. The resistivity of the patterned semiconductor protection layer is between the resistivity of the patterned semiconductor capping layer and the resistivity of the interlayer dielectric layer.

10 Claims, 8 Drawing Sheets

(51) Int. Cl.
 *H01L 29/20* (2006.01)
 *H01L 29/205* (2006.01)
 *H01L 29/423* (2006.01)
 *H01L 29/47* (2006.01)
 *H01L 29/66* (2006.01)

(52) U.S. Cl.
 CPC ...... *H01L 29/205* (2013.01); *H01L 29/42316* (2013.01); *H01L 29/475* (2013.01); *H01L 29/66462* (2013.01)

(56) References Cited

U.S. PATENT DOCUMENTS

| | | | |
|---|---|---|---|
| 9,847,401 B2 * | 12/2017 | Chiu | H01L 21/02458 |
| 9,941,398 B2 * | 4/2018 | Chiu | H01L 29/7783 |
| 10,014,402 B1 * | 7/2018 | Chen | H01L 23/3171 |
| 2006/0019435 A1 * | 1/2006 | Sheppard | H01L 29/778 |
| | | | 257/E29.253 |
| 2016/0141404 A1 * | 5/2016 | Tsai | H01L 29/66462 |
| | | | 438/172 |
| 2016/0351684 A1 * | 12/2016 | Chiu | H01L 23/291 |
| 2019/0123150 A1 * | 4/2019 | MacDonald | H01L 29/66462 |
| 2019/0207022 A1 * | 7/2019 | Nagase | H01L 29/2003 |
| 2020/0119178 A1 | 4/2020 | Okita | |
| 2021/0249269 A1 * | 8/2021 | Aktas | H01L 21/2007 |

\* cited by examiner

HIGH ELECTRON MOBILITY TRANSISTOR AND FABRICATION METHOD THEREOF

BACKGROUND OF THE INVENTION

1. Field of the Invention

The present disclosure relates generally to the field of transistors, and more particularly to high electron mobility transistors and methods of fabricating the same.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. A conventional HEMT may include a compound semiconductor channel layer, a compound semiconductor barrier layer, a p-type compound semiconductor capping layer, a metal capping layer and a gate electrode stacked in sequence. Using the gate electrode to apply a bias voltage on the p-type compound semiconductor capping layer can adjust the concentration of 2-DEG in the compound semiconductor channel layer located under the p-type compound semiconductor capping layer, and thereby control the turn-on/off of the HEMT.

For the metal capping layer disposed between the p-type compound semiconductor capping layer and the gate electrode, the steps of fabricating the metal capping layer usually include a wet lateral etching process. However, the etching degree of the lateral etching process is difficult to be accurately controlled, so that the metal capping layers of individual HEMTs are different in width. Therefore, the consistency of the electrical performances of the individual HEMTs is reduced.

SUMMARY OF THE INVENTION

In view of this, it is necessary to provide an improved high electron mobility transistor without the drawbacks of conventional high electron mobility transistors.

According to one embodiment of the present disclosure, a high electron mobility transistor (HEMT) is disclosed and includes a semiconductor channel layer, a semiconductor barrier layer, a patterned semiconductor protection layer, a patterned semiconductor capping layer, an interlayer dielectric layer, and a gate electrode. The semiconductor channel layer and the semiconductor barrier layer are disposed on a substrate. The patterned semiconductor protection layer is disposed on the semiconductor barrier layer, and the patterned semiconductor capping layer is disposed between the patterned semiconductor protection layer and the semiconductor barrier layer. The interlayer dielectric layer covers the patterned semiconductor capping layer and the patterned semiconductor protection layer, and the interlayer dielectric layer includes a gate contact hole. The gate electrode is disposed in the gate contact hole and is electrically coupled to the patterned semiconductor capping layer, where the patterned semiconductor protection layer is disposed between the gate electrode and the patterned semiconductor capping layer. The resistivity of the patterned semiconductor protection layer is between the resistivity of the patterned semiconductor capping layer and the resistivity of the interlayer dielectric layer.

According to another embodiment of the present disclosure, a method of fabricating a HEMT is disclosed and includes the following steps. A substrate having a semiconductor channel layer, a semiconductor barrier layer, a semiconductor capping layer, and a semiconductor protection layer disposed in sequence thereon is provided; the semiconductor capping layer and the semiconductor protection layer are etched to form a patterned semiconductor capping layer and a patterned semiconductor protection layer respectively; an interlayer dielectric layer is formed to cover the patterned semiconductor capping layer and the patterned semiconductor protection layer; a gate contact hole is formed in the interlayer dielectric layer, where the bottom of the gate contact hole exposes the patterned semiconductor protection layer and is separated from the patterned semiconductor capping layer; and a gate electrode is formed in the gate contact hole, where a portion of the patterned semiconductor protection layer is disposed between the gate electrode and the patterned semiconductor capping layer, and the resistivity of the patterned semiconductor protection layer is between the resistivity of the patterned semiconductor capping layer and the resistivity of the interlayer dielectric layer.

According to the embodiments of the present disclosure, since the resistivity of the patterned semiconductor protection layer is higher than the resistivity of the upper gate electrode, even if the side surfaces of the patterned semiconductor protection layer are not laterally etched, it is not easy to generate point discharge on the side surfaces of the patterned semiconductor protection layer. Therefore, it can avoid unnecessary gate leakage current. Furthermore, since the bottom surface of the gate contact hole will not penetrate the patterned semiconductor protection layer while forming the gate contact hole, it can prevent the etchant from contacting the patterned semiconductor capping layer. Therefore, the original electrical properties of the patterned semiconductor capping layer can be maintained.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

The present disclosure is directed to a high electron mobility transistor (HEMT), which may be used as power switching transistors for voltage converter applications. Compared to silicon power transistors, III-V HEMTs feature low on-state resistances and low switching losses due to wide bandgap properties.

Figure 1:
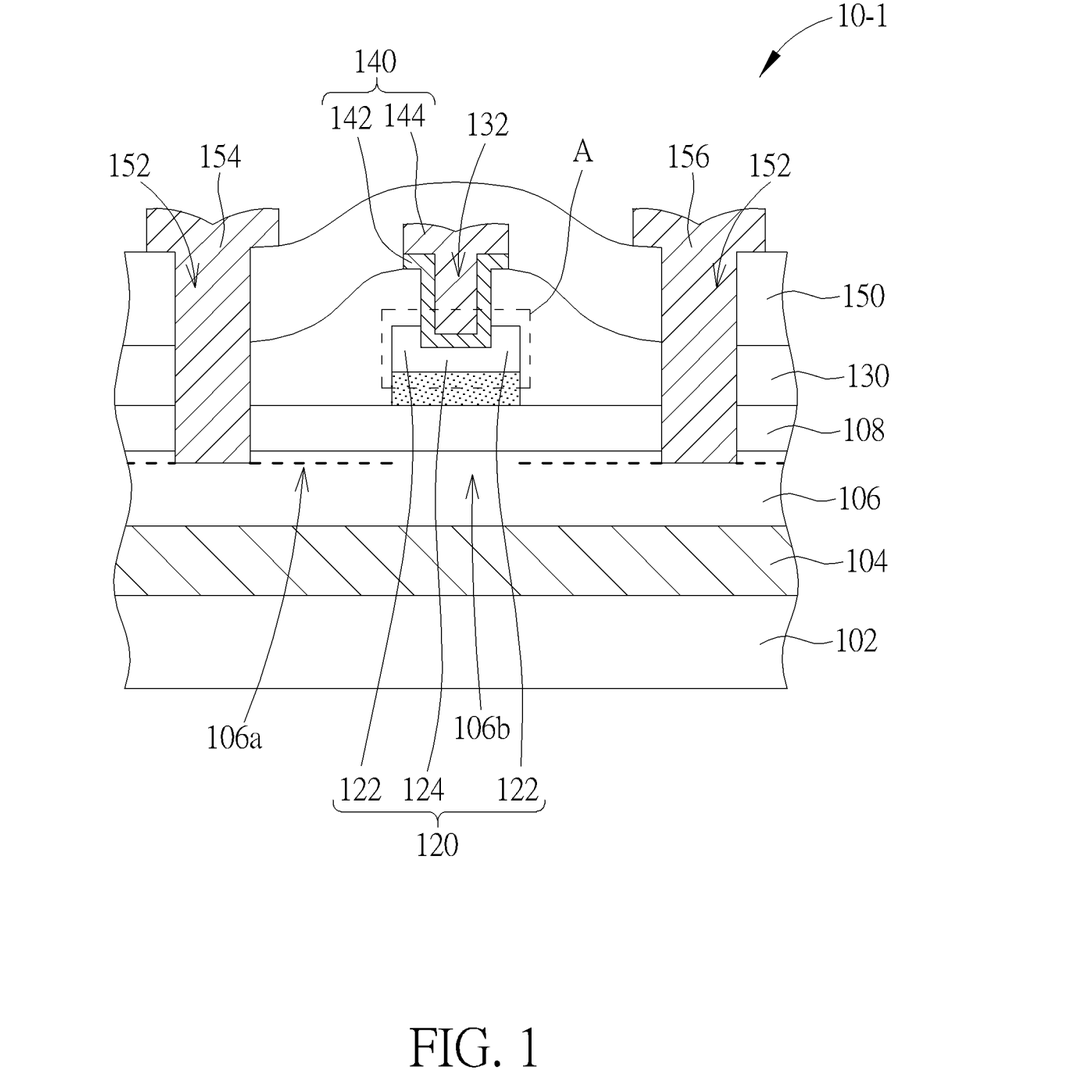
FIG. 1 is a schematic cross-sectional diagram of a high electron mobility transistor (HEMT) according to one embodiment of the disclosure.

FIG. 1 is a schematic cross-sectional diagram of a high electron mobility transistor (HEMT) according to one embodiment of the present disclosure. Referring to FIG. 1, according to one embodiment of the present disclosure, a high electron mobility transistor (HEMT) 10-1, such as an enhancement mode high electron mobility transistor, is disposed on a substrate 102. In addition, a semiconductor channel layer 106, a semiconductor barrier layer 108, a patterned semiconductor capping layer 110, a patterned semiconductor protection layer 120, and an interlayer dielectric layer 130 are stacked in sequence on the substrate 102, and a gate electrode 140 is disposed in the interlayer dielectric layer 130. The resistivity of the patterned semiconductor protection layer 120 is between the resistivity of the patterned semiconductor capping layer 110 and the resistivity of the interlayer dielectric layer 130. According to one embodiment of the present disclosure, the interlayer dielectric layer 130 may cover the patterned semiconductor capping layer 110 and the patterned semiconductor protection layer 120, and a gate contact hole 132 is disposed in the interlayer dielectric layer 130 for accommodating the gate electrode 140. A portion of the patterned semiconductor protection layer 120 is disposed between the gate electrode 140 and the patterned semiconductor capping layer 110.

According to one embodiment of the present disclosure, an optional buffer layer 104 may be disposed between the substrate 102 and the semiconductor channel layer 106. An interlayer dielectric layer 150 may be optionally disposed on the interlayer dielectric layer 130. At least two source/drain contact holes 152 can both penetrate through the interlayer dielectric layers 130 and 150 for accommodating at least two source/drain electrodes 154 and 156 respectively.

According to one embodiment of the present disclosure, the substrate 102 may be a bulk silicon substrate, a silicon carbide (SiC) substrate, a sapphire substrate, a silicon-on-insulator (SOI) substrate or a germanium-on-insulator (GOI) substrate, but not limited thereto. In another embodiment, the substrate 102 further includes a single-layered or multi-layered insulating material layer and/or other suitable material layers (e.g. semiconductor layers) and a core layer. The insulating material layer may be oxide, nitride, oxynitride, or other suitable insulating materials. The core layer may be silicon carbide (SiC), aluminum nitride (AlN), aluminum gallium nitride (AlGaN), zinc oxide (ZnO) or gallium oxide ($Ga_2O_3$), or other suitable ceramic materials. In one embodiment, the single-layered or multi-layered insulating material layer and/or the other suitable material layers may wrap the core layer.

The buffer layer 104 may be used to reduce the stress or the degree of lattice mismatch between the substrate 102 and the semiconductor channel layer 106. According to one embodiment of the present disclosure, the buffer layer 104 may include a plurality of sub-semiconductors, and the overall resistance value thereof is higher than the resistance values of other layers on the substrate 102. In one embodiment, the proportion of some elements in the buffer layer 104, such as metal elements, may be gradually changed in the direction from the substrate 102 to the semiconductor channel layer 106. In one embodiment, for the case where the substrate 102 and the semiconductor channel layer 106 are a silicon substrate and an i-GaN layer, respectively, the buffer layer 104 may be aluminum gallium nitride ($Al_xGa_{(1-x)}N$) with a gradual change in the composition ratio. Moreover, in the direction from the substrate 102 to the semiconductor channel layer 106, the X value will decrease from 0.9 to 0.15 in a continuous or stepwise manner.

The semiconductor channel layer 106 may include one or more layers of group III-V semiconductor layers, and the composition of the group III-V semiconductor layers may be GaN, AlGaN, InGaN, or InAlGaN, but not limited thereto. In addition, the semiconductor channel layer 106 may also be one or more layers of doped group III-V semiconductor layers, for example, a p-type group III-V semiconductor layer. For the p-type group III-V semiconductor layer, the dopant may be C, Fe, Mg, or Zn, but not limited thereto. The semiconductor barrier layer 108 may include one or more layers of group III-V semiconductor layers, and its composition may be different from that of the group III-V semiconductor of the semiconductor channel layer 106. In one embodiment, the semiconductor barrier layer 108 may include AlN, $Al_yGa_{(1-y)}N(0<y<1)$, or a combination thereof. According to one embodiment, the semiconductor channel layer 106 may be an undoped GaN layer, and the semiconductor barrier layer 108 may be an intrinsic n-type AlGaN layer. Since there is a bandgap discontinuity between the semiconductor channel layer 106 and the semiconductor barrier layer 108, by stacking the semiconductor channel layer 106 and the semiconductor barrier layer 108 on each other (and vice versa), a thin layer of two-dimensional electron gas (2-DEG) may be accumulated in a region, i.e., 2-DEG region 106a, near the heterojunction between the semiconductor channel layer 106 and the semiconductor barrier layer 108 due to the piezoelectric effect. In contrast, 2-DEG may not be generated in the region covered by the patterned semiconductor capping layer 110, and thus this region may be regarded as a 2-DEG cutoff region 106b.

The patterned semiconductor capping layer 110 disposed above the semiconductor barrier layer 108 may include one or more layers of group III-V semiconductor layers, and the composition of the group III-V semiconductor layers may be GaN, AlGaN, InGaN or InAlGaN, but not limited thereto. The patterned semiconductor capping layer 110 may be one or more layers of doped group III-V semiconductor layers, for example, a p-type group III-V semiconductor layer. For the p-type group III-V semiconductor layer, the dopant may be C, Fe, Mg or Zn, but not limited thereto. According to one embodiment of the present disclosure, the patterned semiconductor capping layer 110 may be a p-type GaN layer.

The patterned semiconductor protection layer 120 may substantially completely cover the underlying patterned semiconductor capping layer 110, so that its sides may be aligned with the sides of the underlying patterned semiconductor capping layer 110, or slightly retracted or protruded outward from the sides of the underlying patterned semiconductor capping layer 110 (the length of the retraction or protrusion at each side may be 1 to 10 nm, but it is not limited thereto). The composition of the patterned semiconductor protection layer 120 is different from that of the patterned semiconductor capping layer 110. According to one embodiment of the present disclosure, the composition of the patterned semiconductor protection layer 120 may include silicon-containing semiconductors, such as silicon, silicon carbide, silicon oxide, silicon nitride, silicon oxynitride, silicon carbonitride, silicon oxycarbide, silicon oxycarbonitride, metal silicide or a combination thereof. In addition, the crystalline state of the patterned semiconductor protection layer 120 may be single crystalline, polycrystalline, or amorphous. For example, the patterned semiconductor protection layer 120 may be low temperature polysilicon. The resistivity of the patterned semiconductor protection layer 120 may be higher than that of the underlying patterned semiconductor capping layer 110, for example, 10 to 1000 Ω·m, and the resistance along a vertical direction may be $1\times10^4$ to $1\times10^6$ Ω, for example, $1\times10^4$ Ω, $1\times10^5$ Ω, or $1\times10^6$ Ω, but not limited thereto.

The gate electrode 140 may be electrically coupled to the underlying patterned semiconductor capping layer 110, such as a Schottky contact. The bottom of the gate electrode 140 may be embedded in the patterned semiconductor protection layer 120, and still vertically separated from the underlying patterned semiconductor capping layer 110. Therefore, the patterned semiconductor protection layer 120 may include a first portion 122 located at the periphery and a second portion 124 located in the middle. According to one embodiment of the present disclosure, the gate electrode 140 may have a single-layered or multi-layered structure, for example, a double-layered structure including a first conductive layer 142 and a second conductive layer 144. The first conductive layer 142 may be in direct contact with the patterned semiconductor protection layer 120, and its composition includes a Schottky contact metal. The Schottky contact metal refers to a metal, an alloy, or a stacked layer thereof that can generate a Schottky contact with a semiconductor layer. The Schottky contact metal is such as TiN, W, Pt or Ni, but is not limited thereto. The composition of the second conductive layer 144 may include Ti, Al, Au or Mo, but is not limited thereto. According to one embodiment of the present disclosure, the first conductive layer 142 may include a metal nitride containing a refractory metal, and the refractory metal may be selected from a group consisting of titanium, zirconium, hafnium, vanadium, niobium, tantalum, chromium, molybdenum, tungsten, manganese, technetium, rhenium, ruthenium, osmium, rhodium and iridium.

The interlayer dielectric layers 130 and 150 may be disposed in sequence on the semiconductor barrier layer 108, and their materials may be independently selected from $Si_3N_4$, AlN, $Al_2O_3$, $SiO_2$, or a combination thereof, but are not limited thereto. The interlayer dielectric layers 130 and 150 may cover the patterned semiconductor protection layer 120, the patterned semiconductor capping layer 110, the semiconductor barrier layer 108, and the semiconductor channel layer 106. The resistivity of the interlayer dielectric layers 130 and 150 may be higher than the resistivity of the patterned semiconductor protection layer 120. For example, the resistivity of the interlayer dielectric layers 130 and 150 may be $1\times10^{10}$ to $1\times10^{16}$ $\Omega\cdot m$, such as $1\times10^{13}$ $\Omega\cdot m$, but not limited thereto.

The source/drain electrodes 154 and 156 may individually penetrate both the interlayer dielectric layers 130 and 150, and are electrically connected to the underlying semiconductor barrier layer 108 and the semiconductor channel layer 106. According to one embodiment of the present disclosure, the source/drain electrodes 154 and 156 may have a single-layered or multi-layered structure, and its composition may include an ohmic contact metal. The ohmic contact metal refers to a metal, an alloy, or a stacked layer thereof, that can generate ohmic contact with a semiconductor layer. The ohmic contact metal is such as Ti, Ti/Al, Ti/Al/Ti/TiN, Ti/Al/Ti/Au, Ti/Al/Ni/Au or Ti/Al/Mo/Au, but not limited thereto.

Figure 2:
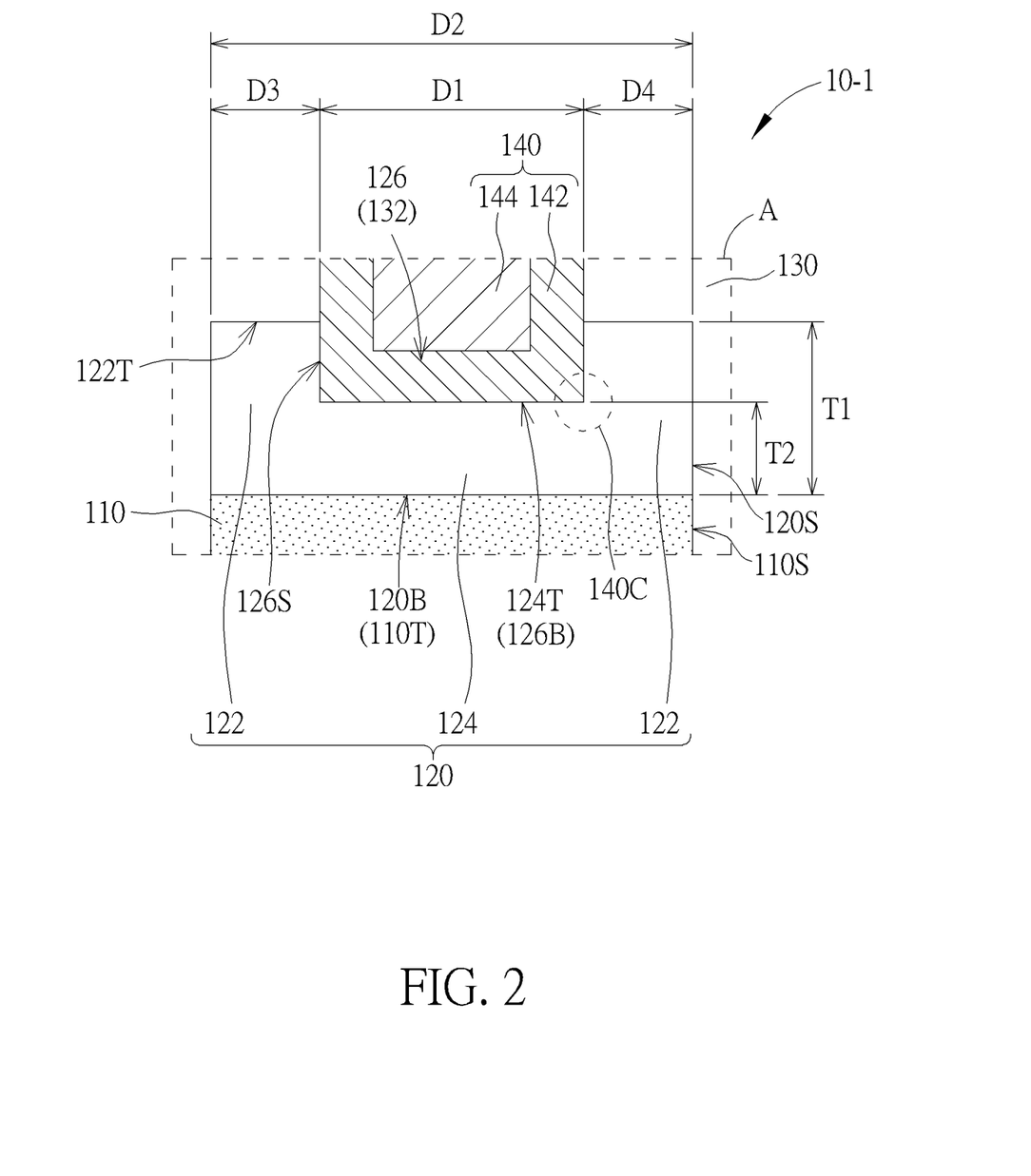
FIG. 2 is a schematic enlarged cross-sectional diagram of a partial area of a HEMT according to one embodiment of the disclosure.

FIG. 2 is a schematic enlarged cross-sectional diagram of a partial area of a HEMT according to one embodiment of the present disclosure, which can correspond to the area A shown in the embodiment of FIG. 1. Referring to FIG. 2, the bottom surface 120B of the patterned semiconductor protection layer 120 may overlap with the top surface 110T of the patterned semiconductor capping layer 110. In addition, the side surfaces 120S of the patterned semiconductor protection layer 120 may be substantially aligned with the side surfaces 110S of the patterned semiconductor capping layer 110, so that the lateral dimensions of the patterned semiconductor protection layer 120 and the patterned semiconductor capping layer 110, such as the width D2, may be substantially equal to each other. According to one embodiment of the present disclosure, the surface of the patterned semiconductor protection layer 120 may have a groove 126 such that the bottom surface 126B and the side surfaces 126S of the groove 126 may coincide with the surface of the patterned semiconductor protection layer 120. The lateral dimension of the groove 126, such as the width D1, may be smaller than the width D2 of the patterned semiconductor capping layer 110, so that the first portion 122 of the patterned semiconductor protection layer 120 may be adjacent to the periphery of the groove 126, and the second portion 124 of the patterned semiconductor protection layer 120 may be disposed directly under the groove 126. The lateral dimension, such as the width, of each first portion 122 located on the periphery of the groove 126 may be the widths D3 and D4, respectively. For example, the widths D3 and D4 may be 20 to 350 nm, and the widths D3 and D4 may be the same as or different from each other, but are not limited thereto. In addition, the thickness T1 of the first portion 122 may be greater than the thickness T2 of the second portion 124. For example, the thickness T2 may be 10 to 100 nm, but is not limited thereto. The lower portion of the gate electrode 140 may fill up the groove 126 to have the width D1, and at least one bottom corner 140C of the gate electrode 140 may be in direct contact with the patterned semiconductor protection layer 120, or be further embedded in the patterned semiconductor protection layer 120.

According to the embodiments of the present disclosure, since the resistivity of the patterned semiconductor protection layer 120 is higher than the resistivity of the overlying gate electrode 140, even if the side surfaces 120S of the patterned semiconductor protection layer 120 are not laterally etched, the patterned semiconductor protection layer 120 will not generate point discharge. Therefore, it can avoid an unnecessary gate leakage current. Moreover, since the width D2 of the patterned semiconductor protection layer 120 may be substantially the same as the width D2 of the patterned semiconductor capping layer 110, the semiconductor devices produced in different batches can still be consistent in electrical properties. In addition, since the bottom corners 140C of the gate electrode 140 may be embedded in the patterned semiconductor protection layer 120 with relatively high resistivity, the patterned semiconductor protection layer 120 can be used to buffer (or reduced) the high-voltage electric field derived from the bottom corners 140C of the gate electrode 140. Therefore, it can improve the stability of the semiconductor devices.

Figure 3:
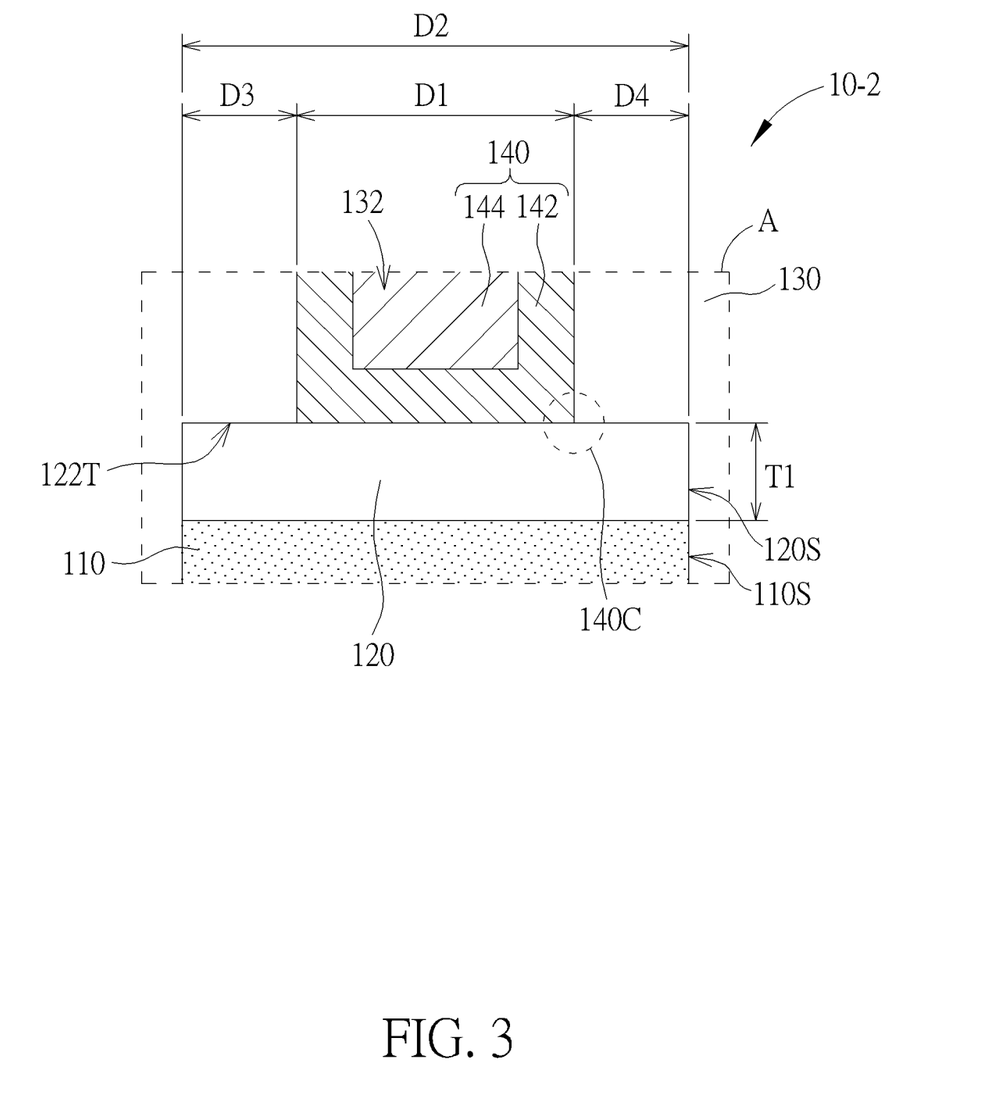
FIG. 3 is a schematic enlarged cross-sectional diagram of a partial area of a HEMT according to another embodiment of the disclosure.

FIG. 3 is a schematic enlarged cross-sectional diagram of a partial area of a HEMT according to another embodiment of the present disclosure. The HEMT 10-2 shown in the embodiment of FIG. 3 is similar to the HEMT 10-1 shown in the embodiment of FIG. 2. The main difference is that the bottom surface of the gate electrode 140 of the HEMT 10-2 is not embedded in the patterned semiconductor protection layer 120. Therefore, for a case where the patterned semiconductor protection layer 120 has the thickness T1, the thickness T1 of the patterned semiconductor protection layer 120 can be kept constant regardless of whether the patterned semiconductor protection layer 120 is located on the periphery of the gate electrode 140 or directly under the gate electrode 140. In addition, since the distance between the gate electrode 140 and the patterned semiconductor capping layer 110 is equal to the thickness T1 of the patterned semiconductor protection layer 120, in order to avoid excessive resistance between the gate electrode 140 and the patterned semiconductor capping layer 110, the thickness T1 of the patterned semiconductor protection layer 120 may be 10 to 100 nm.

Figure 4:
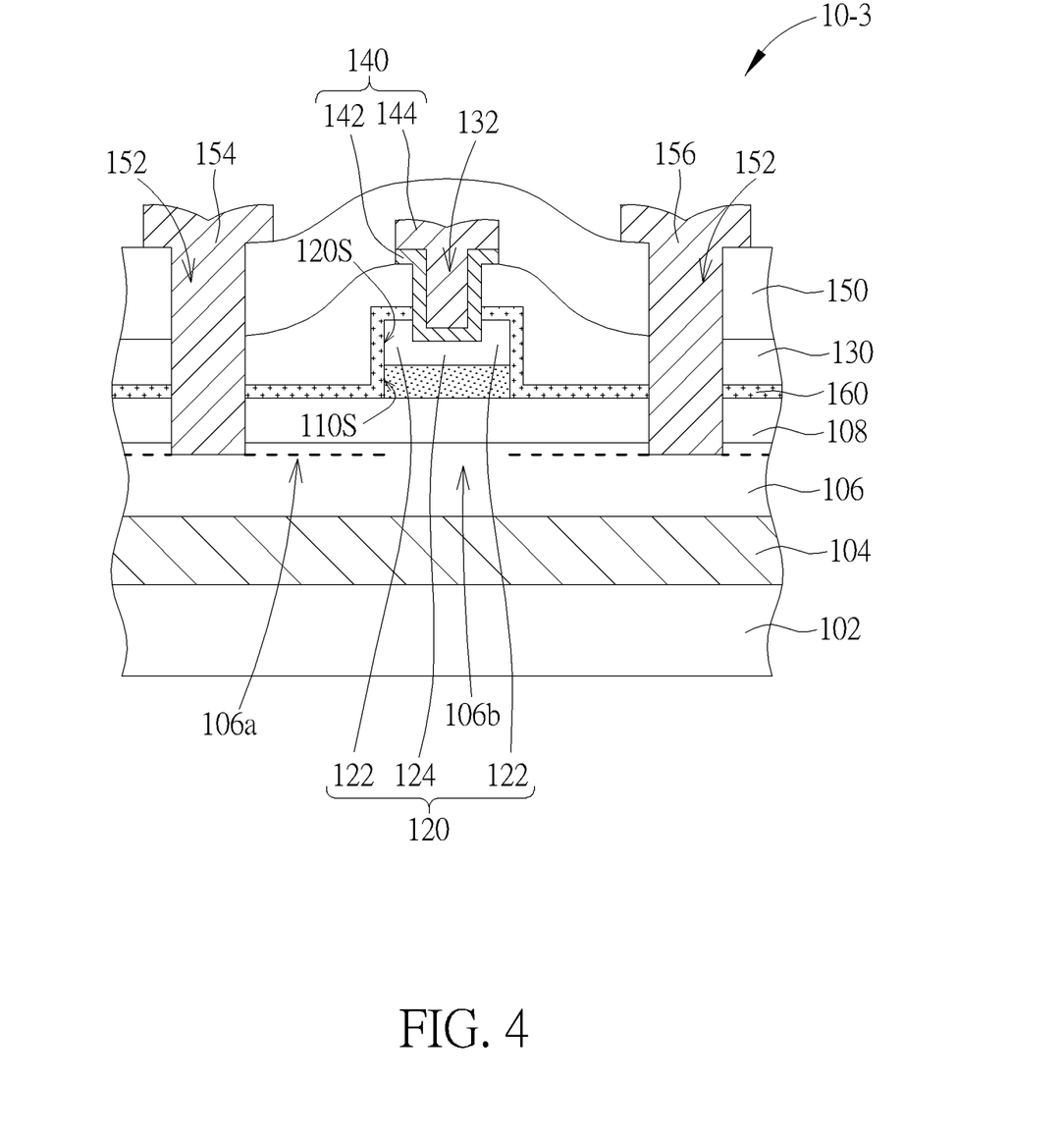
FIG. 4 is a schematic cross-sectional diagram of a HEMT according to another embodiment of the disclosure.

FIG. 4 is a schematic cross-sectional diagram of a HEMT according to another embodiment of the present disclosure. The HEMT 10-3 shown in the embodiment of FIG. 4 is similar to the HEMT 10-1 shown in the embodiment of FIG. 1. The main difference is that a conformal passivation layer 160 is additionally disposed between the interlayer dielectric layer 130 and the semiconductor barrier layer 108, the patterned semiconductor capping layer 110, and the patterned semiconductor protection layer 120 in the HEMT 10-3. The passivation layer 160 can be used to eliminate or reduce surface defects existing on the top surface of the semiconductor barrier layer 108, the side surfaces 110S of the patterned semiconductor capping layer 110, and the side surfaces 120S of the patterned semiconductor protection layer 120, and thereby improving the electrical performances of the HEMT 10-3. According to one embodiment of the present disclosure, the resistivity of the passivation layer 160 is higher than the resistivity of the patterned semiconductor protection layer 120, and the composition of the passivation layer 160 may be silicon nitride ($Si_3N_4$), silicon oxynitride (SiON), or aluminum nitride (AlN), aluminum oxide ($Al_2O_3$) or silicon oxide ($SiO_2$), but not limited thereto.

In order to enable a person having ordinary skill in the art to implement the embodiments of the present disclosure, the following further describes the fabricating method of the disclosed HEMTs.

Figure 5:
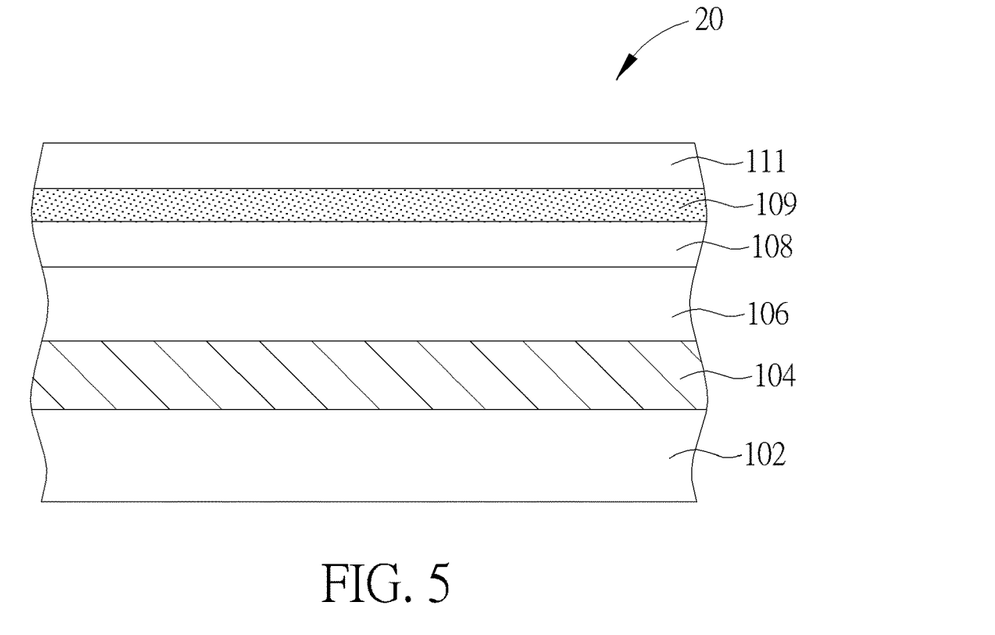
FIG. 5 is a schematic cross-sectional diagram of fabricating a HEMT which includes several semiconductor layers stacked in sequence according to one embodiment of the disclosure.
Figure 10:
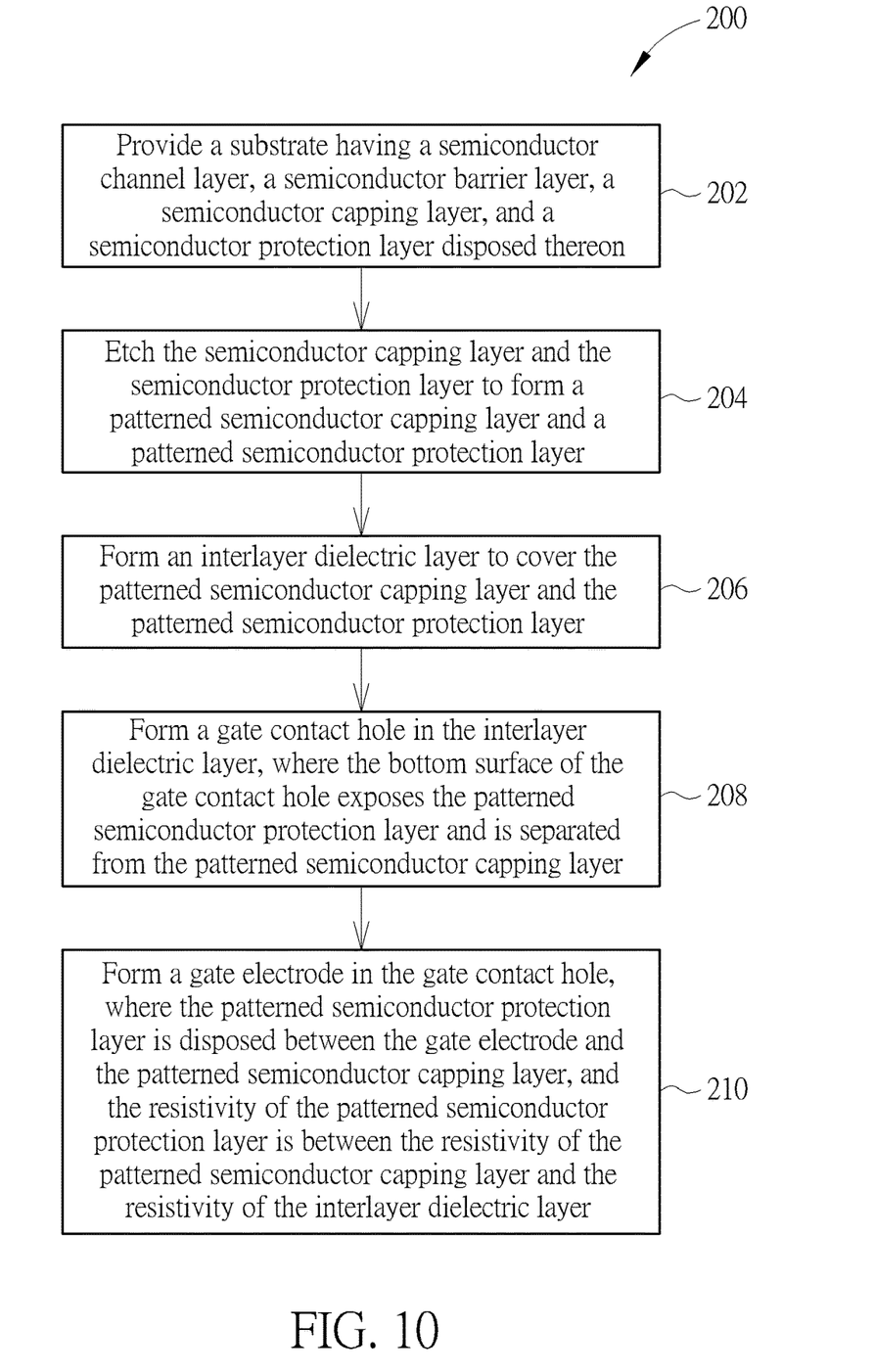
FIG. 10 is a flowchart illustrating a method of fabricating a HEMT according to one embodiment of the disclosure.

FIG. 5 is a schematic cross-sectional diagram of fabricating a HEMT which includes several semiconductor layers stacked in sequence according to one embodiment of the present disclosure. FIG. 10 is a flowchart illustrating a method of fabricating a HEMT according to one embodiment of the present disclosure. According to one embodiment of the present disclosure, step 202 of a fabricating method 200 is performed to provide a substrate, and the substrate has a semiconductor channel layer, a semiconductor barrier layer, a semiconductor capping layer, and a semiconductor protection layer disposed thereon in sequence. Referring to FIG. 5, a buffer layer 104, a semiconductor channel layer 106, a semiconductor barrier layer 108, a semiconductor capping layer 109 and a semiconductor protection layer 111 may be sequentially stacked on a substrate 102 of a semiconductor structure 20. The various stacked layers on the substrate 102 may be formed by any suitable methods, such as molecular-beam epitaxy (MBE), metal-organic chemical vapor deposition (MOCVD), hydride vapor phase epitaxy (HVPE), atomic layer deposition (ALD) or other suitable methods.

Figure 6:
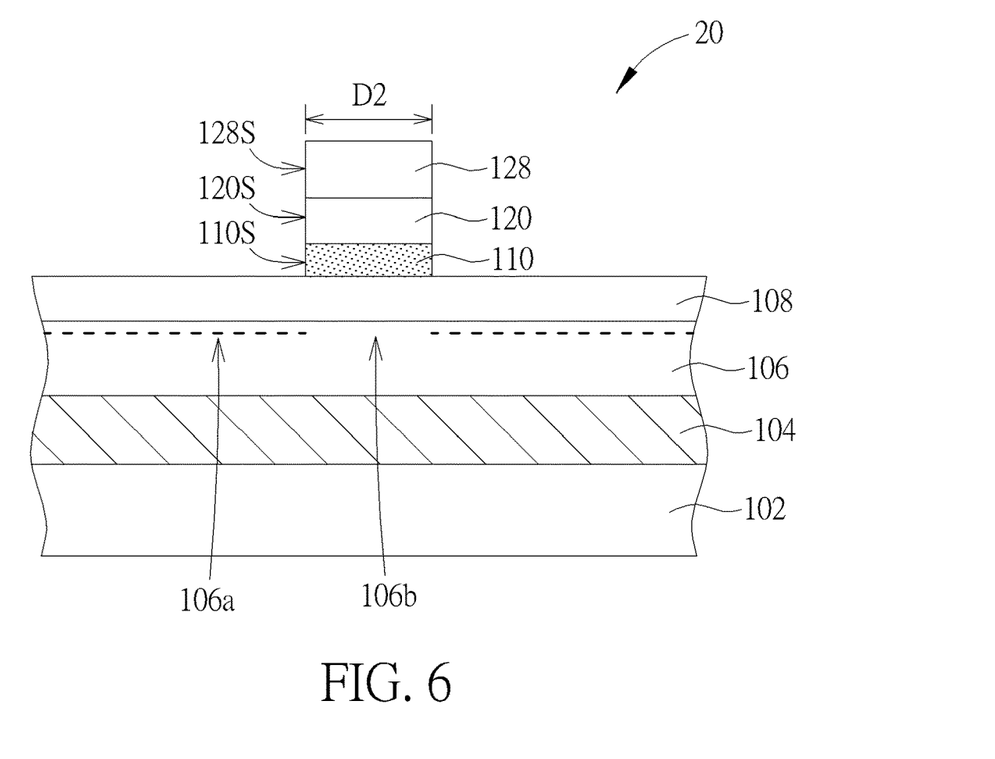
FIG. 6 is a schematic cross-sectional diagram of fabricating a HEMT which includes a patterned semiconductor capping layer, a patterned semiconductor protection layer, and a mask layer according to one embodiment of the disclosure.

FIG. 6 is a schematic cross-sectional diagram of fabricating a HEMT according to one embodiment of the present disclosure, where the HEMT includes a patterned semiconductor capping layer, a patterned semiconductor protection layer and a mask layer. According to one embodiment of the present disclosure, after the step shown in the embodiment of FIG. 5, photolithography and etching processes may be performed to forma mask layer 128 with a feature pattern. Subsequently, step 204 is performed to etch the semiconductor capping layer and the semiconductor protection layer to forma patterned semiconductor capping layer and a patterned semiconductor protection layer, respectively. For example, by using the mask layer 128 as an etching mask, the etching process may be performed to sequentially remove the portions of the semiconductor protection layer 111 and the semiconductor capping layer 109 which are exposed from the mask layer 128, thereby forming the patterned semiconductor protection layer 120 and the patterned semiconductor capping layer 110. According to one embodiment of the present disclosure, since the feature pattern defined by the mask layer 128 is transferred to the underlying semiconductor protection layer 111 and the semiconductor capping layer 109 by a vertical anisotropic etching. Therefore, the mask layer 128, the patterned semiconductor protection layer 120 and the patterned semiconductor capping layer 110 may have substantially the same lateral dimension, such as the width D2. Thus, the side surfaces 128S of the mask layer 128, the side surfaces 110S of the patterned semiconductor capping layer 110, and the side surfaces 120S of the patterned semiconductor protection layer 120 may be substantially aligned with each other. In addition, for the area not covered by the patterned semiconductor capping layer 110, two-dimensional electron gas (2-DEG) can be generated in the 2-DEG region 106a due to the piezoelectric effect generated between the semiconductor channel layer 106 and the semiconductor barrier layer 108. In contrast, for the area covered by the patterned semiconductor capping layer 110, since no 2-DEG is generated, it can be regarded as the 2-DEG cutoff region 106b.

After the patterned semiconductor protection layer 120 and the patterned semiconductor capping layer 110 are formed, the mask layer 128 may be removed to expose the top surface of the patterned semiconductor protection layer 120.

Figure 7:
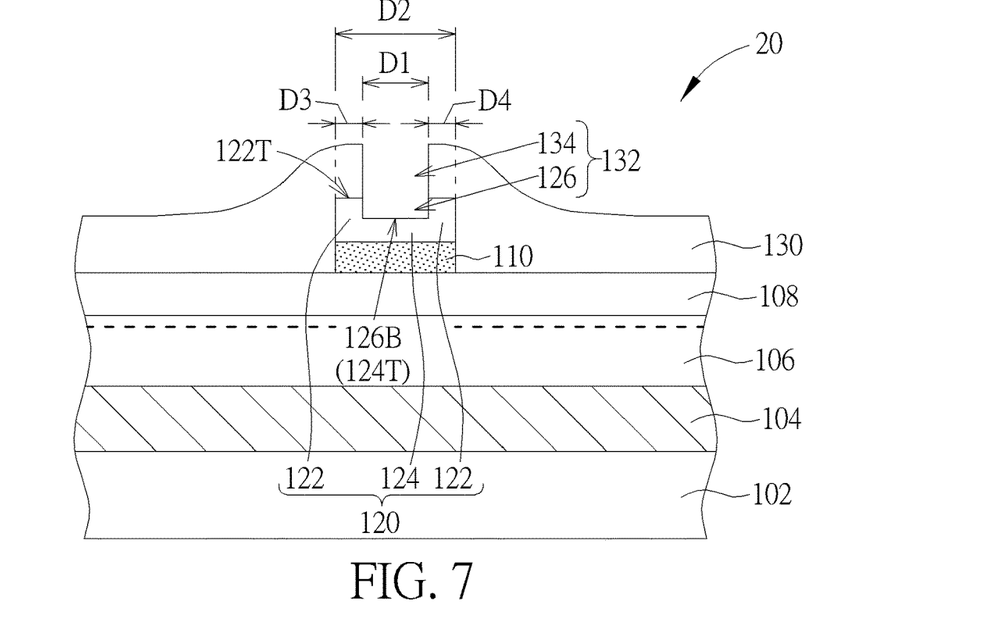
FIG. 7 is a schematic cross-sectional diagram of fabricating a HEMT which includes a gate contact hole disposed in an interlayer dielectric layer according to one embodiment of the disclosure.

FIG. 7 is a schematic cross-sectional diagram of fabricating a HEMT according to one embodiment of the present disclosure, where the HEMT includes a gate contact hole disposed in an interlayer dielectric layer. According to one embodiment of the present disclosure, step 206 is performed to form an interlayer dielectric layer to cover the patterned semiconductor capping layer and the patterned semiconductor protection layer. For example, an interlayer dielectric layer 130 may be formed through a suitable deposition process to completely cover the patterned semiconductor protection layer 120, the patterned semiconductor capping layer 110, the semiconductor barrier layer 108, and the semiconductor channel layer 106. Before the mask layer 128 is removed and after the interlayer dielectric layer 130 is formed, the width D2 of the patterned semiconductor protection layer 120 can be maintained constant, so that the side surfaces 110S of the patterned semiconductor capping layer 110 and the side surfaces 120S of the patterned semiconductor protection layer 120 may be substantially aligned with each other. The material of the interlayer dielectric layer 130 may be $Si_3N_4$, AlN, $Al_2O_3$ or $SiO_2$, but not limited thereto.

Subsequently, step 208 is performed to form a gate contact hole in the interlayer dielectric layer, where the bottom surface of the gate contact hole may expose the patterned semiconductor protection layer and is separated from the patterned semiconductor capping layer. For example, an opening 134 is formed in the interlayer dielectric layer 130 and a groove 126 is formed on the surface of the patterned semiconductor protection layer 120 in sequence by performing photolithography and etching processes. The opening 134 and the groove 126 may construct a gate contact hole 132. Therefore, the patterned semiconductor protection layer 120 may be exposed from the gate contact hole 132. The width D1 of the gate contact hole 132 may be smaller than the width D2 of the patterned semiconductor protection layer 120. The bottom surface 126B of the gate contact hole 132 may be located in the patterned semiconductor protection layer 120 and separated from the patterned semiconductor capping layer 110. Therefore, the top surface 122T of the first portion 122 of the patterned semiconductor protection layer 120 may be higher than the top surface 124T of the second portion 124 of the patterned semiconductor protection layer 120. According to one embodiment of the present disclosure, the etching process for forming the gate contact hole 132 may include a dry etching process, such as a plasma etching process. Since the bottom surface of the gate contact hole 132 will not penetrate the patterned semiconductor protection layer 120 during the etching process, it can prevent a high-energy etchant (such as plasma etchant) from contacting the patterned semiconductor capping layer 110. Therefore, the original electrical properties of the patterned semiconductor capping layer 110 may be maintained.

Figure 8:
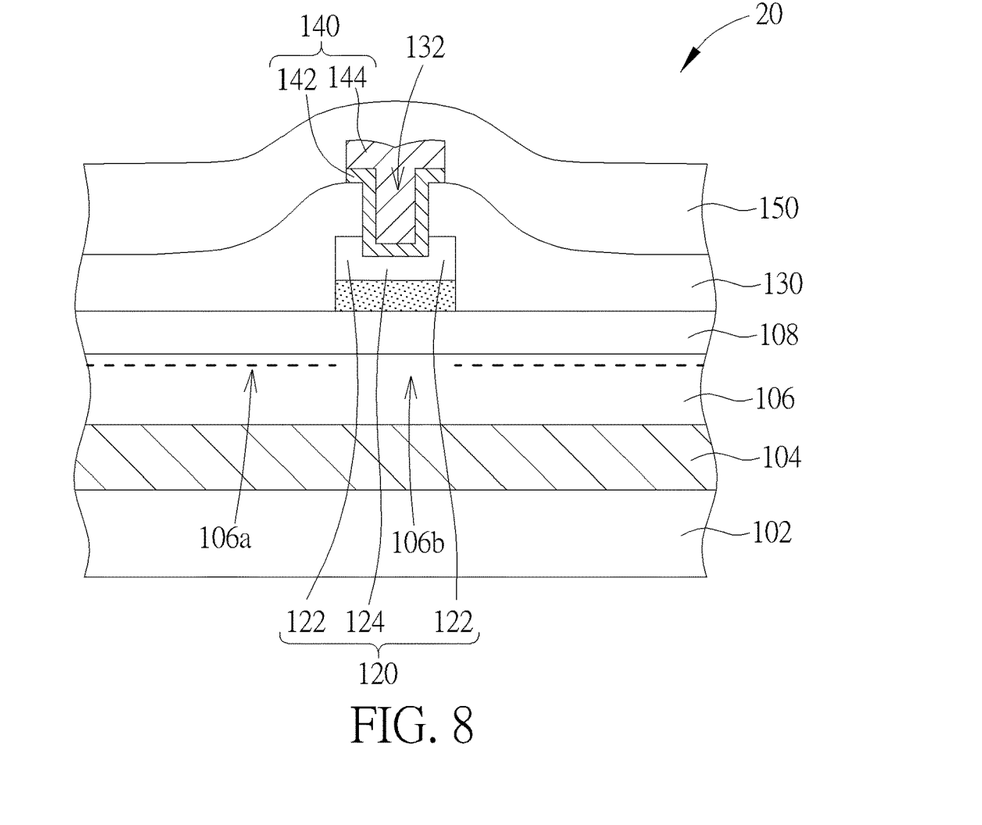
FIG. 8 is a schematic cross-sectional diagram of fabricating a HEMT which includes a gate electrode according to one embodiment of the disclosure.

FIG. 8 is a schematic cross-sectional diagram of fabricating a HEMT according to one embodiment of the present disclosure, where the HEMT includes a gate electrode. According to one embodiment of the present disclosure, after the steps shown in the embodiment of FIG. 7, step 210 is performed to form a gate electrode in the gate contact hole, where a portion of the patterned semiconductor protection layer is disposed between the gate electrode and the patterned semiconductor capping layer. For example, a suitable deposition process may be performed to form a single-layered or multi-layered conductive layer (not shown) on the top surface of the interlayer dielectric layer 130 and in the gate contact hole 132. Afterwards, photolithography and etching processes are performed to pattern the conductive layer to thereby form the gate electrode 140. According to one embodiment of the present disclosure, for the gate contact hole 132 with a small opening area, the gate electrode 140 may completely fill up the gate contact hole 132, but it is not limited thereto. According to one embodiment of the present disclosure, the gate electrode 140 may be disposed only along the inner wall of the gate contact hole 132 without filling up the gate contact hole 132. Subsequently, an additional interlayer dielectric layer or passivation layer, such as an interlayer dielectric layer 150, is formed on the interlayer dielectric layer 130 to cover the gate electrode 140.

Figure 9:
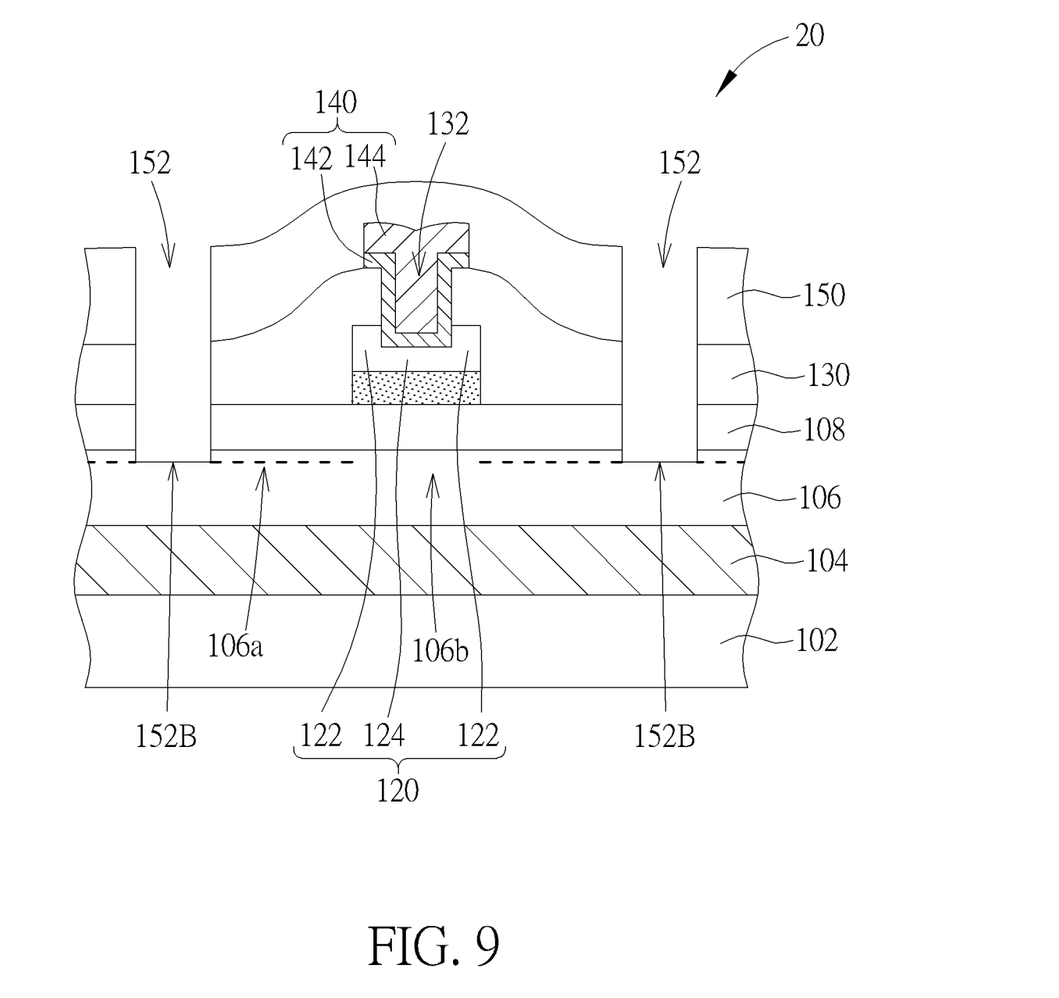
FIG. 9 is a schematic cross-sectional diagram of fabricating a HEMT which includes source and drain contact holes disposed in an interlayer dielectric layer according to one embodiment of the disclosure.

FIG. 9 is a schematic cross-sectional diagram of fabricating a HEMT according to one embodiment of the present disclosure, where the HEMT includes source and drain contact holes disposed in an interlayer dielectric layer. Referring to FIG. 9, photolithography and etching processes may be performed to form at least one source/drain contact hole on each side of the gate electrode 140, such as two individual source/drain contact holes 152 disposed on two sides of the gate electrode 140 respectively. When the etching process is completed, the bottom surface 152B of each source/drain contact hole 152 may be located in the semiconductor barrier layer 108 or further extended into the semiconductor channel layer 106 to expose the semiconductor channel layer 106. In addition, since the bottom surface 152B of the source/drain contact hole 152 may be located in the semiconductor barrier layer 108 or the semiconductor channel layer 106, a two-dimensional electron gas (2-DEG) cutoff region 106b is correspondingly formed under each source/drain contact hole 152.

Subsequently, a suitable deposition process may be performed to form a single-layered or multi-layered conductive layer (not shown) on the top surface of the interlayer dielectric layer 150 and in the source/drain contact holes 152. Thereafter, photolithography and etching processes are performed to pattern the conductive layer and to thereby form source/drain electrodes 154 and 156 that are similar to those shown in FIG. 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a semiconductor channel layer and a semiconductor barrier layer, disposed on a substrate;
   a patterned semiconductor protection layer, disposed on the semiconductor barrier layer, wherein a composition of the patterned semiconductor protection layer comprises a silicon-containing semiconductor;
   a patterned semiconductor capping layer, disposed between the patterned semiconductor protection layer and the semiconductor barrier layer, wherein a side surface of the patterned semiconductor protection layer is aligned with a side surface of the patterned semiconductor capping layer;
   an interlayer dielectric layer, covering the patterned semiconductor capping layer and the patterned semiconductor protection layer, wherein the interlayer dielectric layer includes a gate contact hole; and
   a gate electrode, disposed in the gate contact hole and electrically coupled to the patterned semiconductor capping layer, wherein a portion of the patterned semiconductor protection layer is disposed between the gate electrode and the patterned semiconductor capping layer, and wherein the resistivity of the patterned semiconductor protection layer is between the resistivity of the patterned semiconductor capping layer and the resistivity of the interlayer dielectric layer.

2. The high electron mobility transistor of claim 1, wherein the width of the gate contact hole is smaller than the width of the patterned semiconductor protection layer.

3. The high electron mobility transistor of claim 1, wherein the gate electrode electrically coupled to the patterned semiconductor capping layer is through a Schottky contact.

4. The high electron mobility transistor of claim 1, wherein the resistivity of the patterned semiconductor protection layer is higher than the resistivity of the gate electrode.

5. The high electron mobility transistor of claim 1, wherein the gate electrode is in direct contact with the patterned semiconductor protection layer.

6. The high electron mobility transistor of claim 5, wherein the gate electrode includes a bottom corner that is in direct contact with the patterned semiconductor protection layer.

7. The high electron mobility transistor of claim 1, wherein:
   a composition of the patterned semiconductor capping layer is a p-type group III-V semiconductor; and
   a composition of the gate electrode comprises a metal.

8. The high electron mobility transistor of claim 1, wherein a surface of the patterned semiconductor protection layer comprises a groove, and the gate electrode fills up the groove.

9. The high electron mobility transistor of claim 8, wherein the patterned semiconductor protection layer comprises at least one first portion and a second portion, the at least one first portion is disposed on the periphery of the groove, the second portion is disposed under the groove, and the thickness of the at least one first portion is greater than the thickness of the second portion.

10. The high electron mobility transistor of claim 1, further comprising a passivation layer, conformally disposed on a top surface of the semiconductor barrier layer, side surfaces of the patterned semiconductor capping layer, and side surfaces and a top surface of the patterned semiconductor protection layer.

* * * * *